(12) United States Patent
Awad et al.

(10) Patent No.: US 7,962,322 B2
(45) Date of Patent: *Jun. 14, 2011

(54) DESIGN STRUCTURE FOR COMPENSATING FOR VARIANCES OF A BURIED RESISTOR IN AN INTEGRATED CIRCUIT

(75) Inventors: Elie Awad, Essex Junction, VT (US); Mariette Awad, Essex Junction, VT (US); Kai Di Feng, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 404 days.

This patent is subject to a terminal disclaimer.

(21) Appl. No.: 12/135,232

(22) Filed: Jun. 9, 2008

(65) Prior Publication Data

US 2008/0234997 A1    Sep. 25, 2008

Related U.S. Application Data

(63) Continuation-in-part of application No. 11/419,323, filed on May 19, 2006, now Pat. No. 7,595,681.

(51) Int. Cl.
G06F 17/50 (2006.01)
H01L 35/00 (2006.01)

(52) U.S. Cl. .......................................... 703/14; 327/513
(58) Field of Classification Search .................. 703/14; 716/2; 327/513

See application file for complete search history.

(56) References Cited

U.S. PATENT DOCUMENTS

| | | | |
|---|---|---|---|
| 5,465,264 A | 11/1995 | Buhler et al. | |
| 5,519,328 A | 5/1996 | Bennett | |
| 5,572,161 A * | 11/1996 | Myers | 327/538 |
| 5,811,993 A | 9/1998 | Dennard et al. | |
| 5,838,191 A | 11/1998 | Opris et al. | |
| 6,097,564 A | 8/2000 | Hunter | |
| 6,208,215 B1 | 3/2001 | Sauer | |
| 6,317,001 B1 | 11/2001 | Roth | |
| 6,812,735 B1 * | 11/2004 | Pham | 326/30 |
| 2003/0074489 A1 * | 4/2003 | Steger et al. | 710/1 |
| 2004/0221217 A1 * | 11/2004 | Sato et al. | 714/745 |

\* cited by examiner

*Primary Examiner* — Paul L Rodriguez
*Assistant Examiner* — Eunhee Kim
(74) *Attorney, Agent, or Firm* — David Cain

(57) ABSTRACT

A design structure comprising elements that when processed in a computer-aided design system generates a machine-executable representation of a circuit that compensates for variances in the resistance of the buried resistor during operation of the integrated circuit using a waveform that is representative of the thermal characteristics of the buried resistor.

8 Claims, 4 Drawing Sheets

DESIGN STRUCTURE FOR COMPENSATING FOR VARIANCES OF A BURIED RESISTOR IN AN INTEGRATED CIRCUIT

CROSS-REFERENCE TO RELATED APPLICATIONS

This application is a continuation-in-part of U.S. patent application Ser. No. 11/419,323, filed May 19, 2006, now U.S. Pat. No. 7,595,681 and is related to U.S. patent application Ser. No. 12/135,231 filed concurrently herewith. All Applications are assigned to the present Assignee.

TECHNICAL FIELD OF THE PRESENT INVENTION

The present invention generally relates to a design structure for buried resistors in integrated circuits and, more specifically, to design structures that compensate for variances in the resistance of the buried resistor during operation of the integrated circuit.

BACKGROUND OF THE INVENTION

Buried resistors (BR) are used in integrated circuits for multiple purposes such as resistance matching in transmitters and receivers. Unfortunately, the resistance of the BR changes as its temperature increases or decreases.

The significance of accounting for these resistance variations has become increasingly important as the clock speeds of the integrated circuits continue to rise. This results from the need for accurate resistance matching to support the increased clock speed and the thermal fluctuations from the increased switching. In addition, these resistance variations are even more pronounced in Silicon-On-Insulator technologies since the buried oxide layer located beneath the resistor acts as a thermal insulator.

Circuit designers have created a number of solutions for compensating for these variations in BR resistance. For example, one design uses multiple resistance branches in parallel that can be selectively turned on to create the desired resistance. The number of resistors that are turned on is based on a predetermined algorithm that uses the time-averaged bulk temperature of the integrated circuit.

Unfortunately, these current solutions fail to provide accurate resistance matching during all phases of the operation of the integrated circuit and are not sufficiently dynamic so as to account for temperature swings that happen during switching.

It would, therefore, be a distinct advantage to have a method and apparatus that can accurately compensate for dynamic variances in the resistance of a BR during switching or otherwise caused from thermal variances.

SUMMARY OF THE PRESENT INVENTION

In one aspect, the present invention is a design structure for a circuit for altering the perceived resistance of a buried resistor. The circuit includes a wave generator that generates a waveform that is representative of the thermal characteristics of the buried resistor. The compensation circuit also includes a compensation circuit that receives the generated waveform and alters the perceived resistance according to the waveform.

BRIEF DESCRIPTION OF THE DRAWINGS

The present invention will be better understood and its advantages will become more apparent to those skilled in the art by reference to the following drawings, in conjunction with the accompanying specification, in which.

DETAILED DESCRIPTION

The present invention is a design structure for compensating for variances in the resistance of an embedded resistor or buried resistor (BR) resulting from temperature fluctuations. More specifically, the present invention uses a compensation circuit to alter the perceived resistance of the buried resistor according to its thermal time constraints as explained below.

In the preferred embodiment of the present invention, BRs are implemented in Silicon-On-Insulator (SOI) technology. The relationship of the resistance of the BR to temperature can be expressed mathematically by the following equation: The resistance of the BR resistor is given by $$R = R_S(BR) \times \frac{(L - L_{SR})}{W + \Delta W} \times (1 + TCR \times \frac{(T - 25 + (RTHXP)}{100}$$

Where
R=resistance in Ohms.
$R_S$(BR)=Sheet resistance of BR resistor.
L=scaled length in μm
w=scaled width in μm
LSR=length adjustment to allow for spreading resistance at ends of resistor.
ΔW=width adjustment
TCR=temperature coefficient of resistance.
RTH=$RTH_{SP}$/RX (thermal resistance).
$RTH_{SP}$=133 deg C.–μm²/mW (specific thermal resistance)
P=power dissipated by resistor (V×1)

The above noted equation illustrates that the resistance of the BR is directly proportional to its temperature. Consequently, if the transient behavior of the temperature of the BR (i.e., thermal behavior) can be determined, then the resistance can be predicted.

The thermal behavior of a BR can be determined by simulating various designs and BR geometries over a range of time (e.g., 1 ns to 0.2 seconds). For this purpose, any finite element analysis simulation software such as ANSYS™ produced by ANSYS Inc. can be used.

Figure 1:
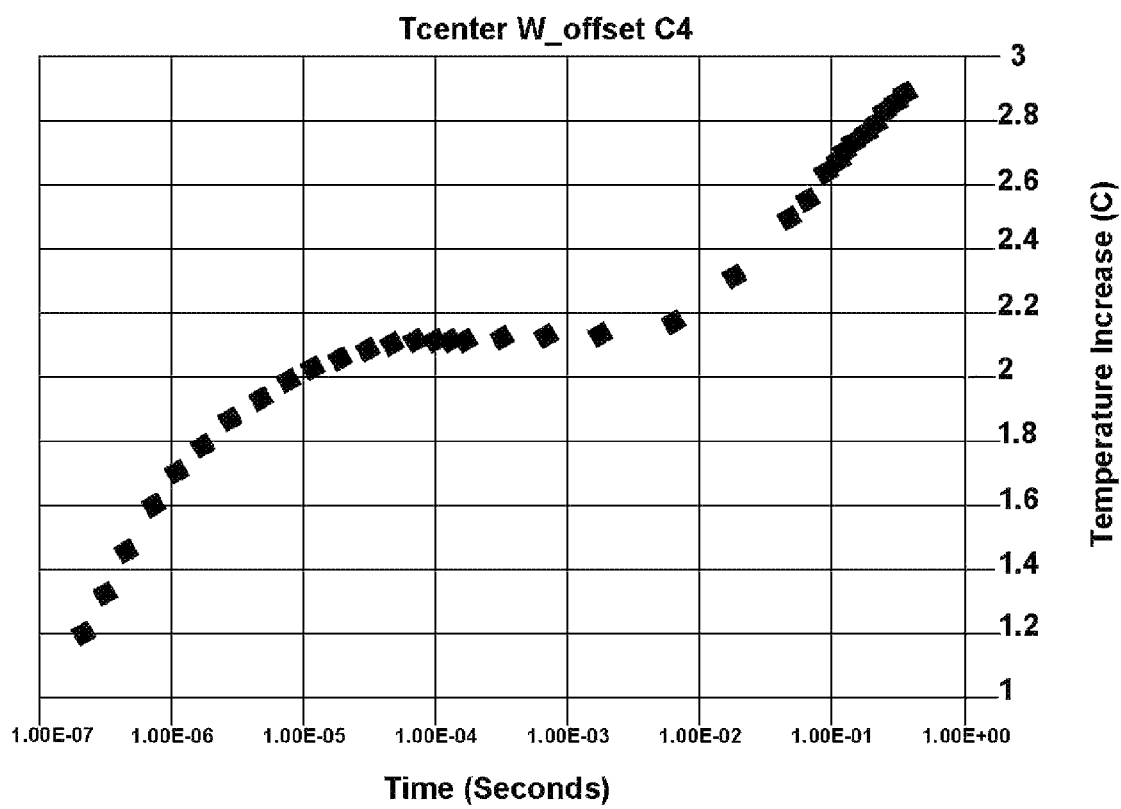
FIG. 1 is a plot diagram illustrating the results of using finite element analysis simulation software to simulate the transient thermal response of sample circuit designs containing a set of Buried Resistors according to the teachings of the present invention.

Reference now being made to FIG. 1, a plot diagram is shown illustrating the results of using finite element analysis simulation software to simulate the transient thermal response of sample circuit designs containing a set of BRs according to the teachings of the present invention. In this Figure, the x-axis represents time and the y-axis represents a relative temperature variance measured in Celsius degrees.

A time response pattern for the thermal response of the BR can be seen from the plot of FIG. 1. The pattern reveals an initial rapid increase (i.e., time period $10^{-07}$ to $10^{-05}$ less than 0.1 milli-seconds) followed by a slower increase (i.e., time period $10^{-02}$ to $10^{-01}$ about 200 milli-seconds). In other words, the thermal response of the BR can be characterized by at least two time constants (tau).

Figure 2:
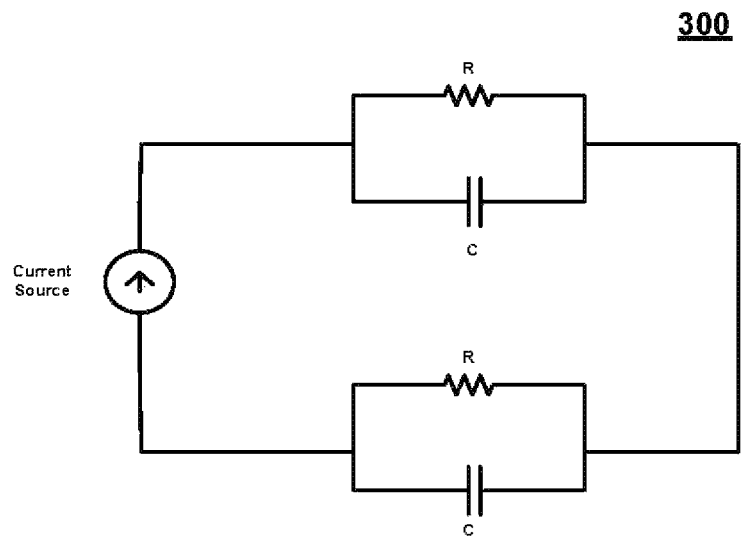
FIG. 2 is a diagram of an approximate circuit model for an electrical circuit whose electrical response approximates the thermal response of the Buried Resistors as exhibited in the plot of FIG. 1 according to the teachings of the present invention.

This time response pattern can be represented and reproduced using analogous electrical elements such as a current source (analogous to the heat generation) and two consecutive sets of Resistor and Capacitor (RC) branches in series (analogous to the thermal resistive and capacitive properties of the structure encompassing the BRs) to create a circuit 300 as illustrated by FIG. 2.

Figure 3:
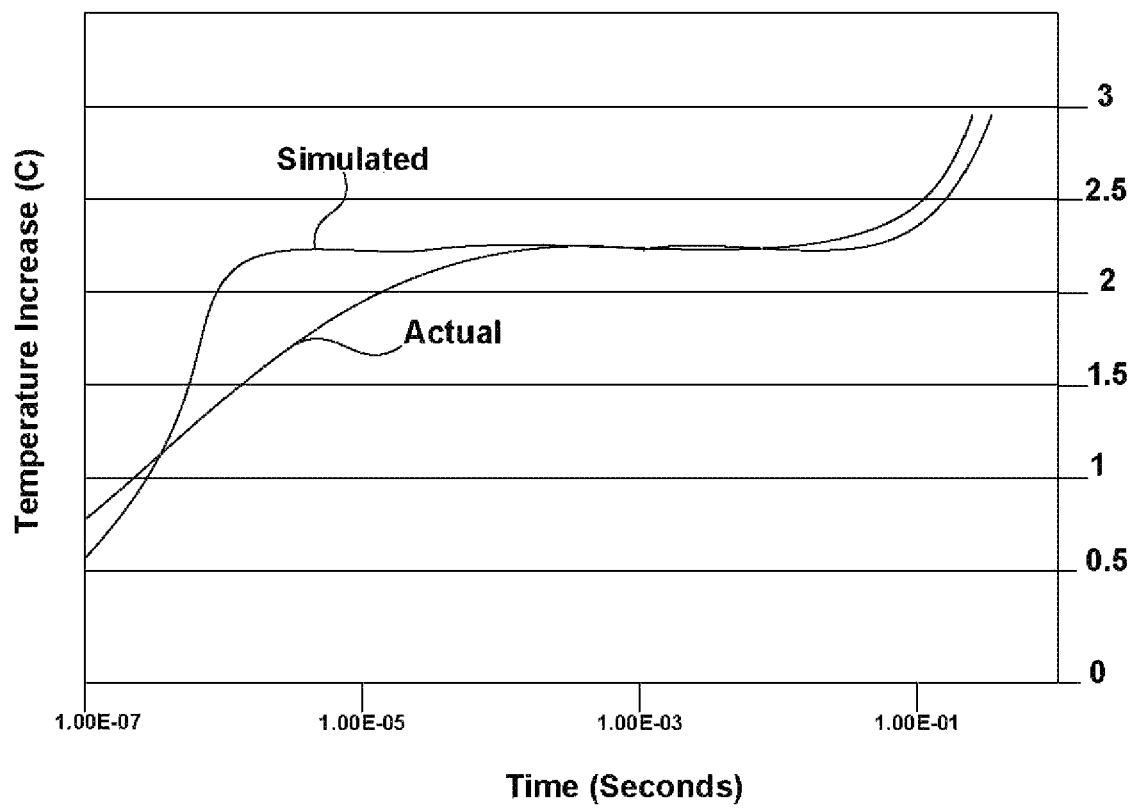
FIG. 3 is a plot diagram comparing the actual thermal response of a Buried Resistor circuit relative to the behavior predicted by the approximate circuit model shown in FIG. 2 according to the teachings of the present invention.

Simulation of the circuit 300 as plotted against the previous simulations of FIG. 1 is illustrated in FIG. 3. As shown, the circuit 300 does not completely match the complexity of the initial behavioral ramp-up. If desired, adding additional RC branches in series in the circuit 300 will increase the accuracy of matching the initial behavioral ramp-up.

Figure 4:
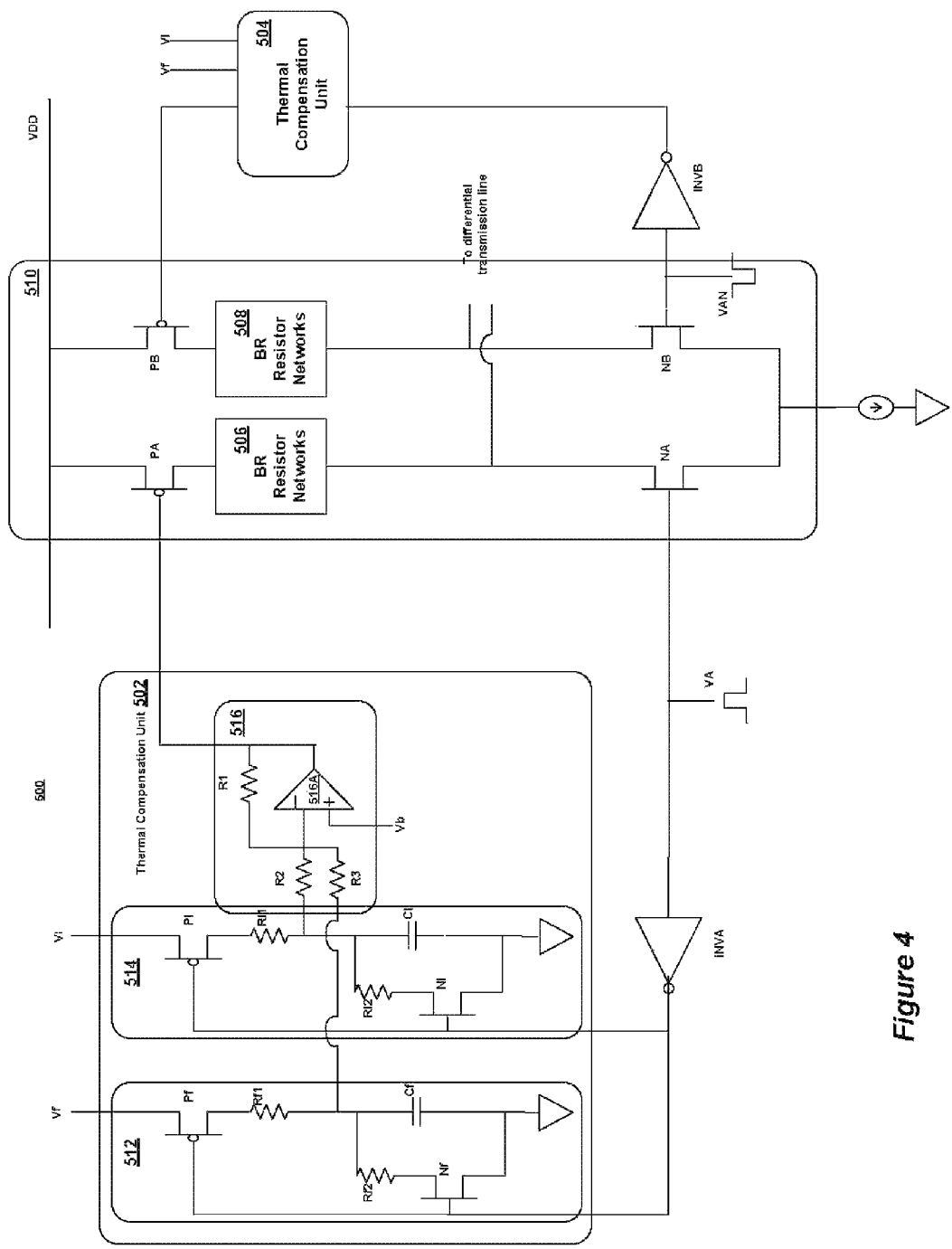
FIG. 4 is a differential driver circuit illustrating the use of compensation units to compensate for temperature variations in the BR resistor networks according to the teachings of the present invention.

A compensation circuit can be designed using the above information for the BR thermal behavior characteristics (i.e., the circuit will have time constraints that match the thermal time constraints but are timed to reverse its behavior) as illustrated in FIG. 4.

Reference now being made to FIG. 4, a differential driver circuit 500 is shown that illustrates the use of thermal compensation units 502 and 504 to compensate for temperature variations in the BR resistor networks 506 and 508 according to the teachings of the present invention. The differential driver circuit 500 includes thermal compensation circuits 502 and 504, differential driver 510, and inverters INVA and INVB. Differential driver 510 is configured in a typical fashion having PFETS (p-type MOSFETS in the preferred embodiment) PA and PB (PA and PB are near identical) coupled in series with VDD, BR resistor networks 506 and 508, and NFETs NA and NB (n-type MOSFETs in the preferred embodiment), respectively. The total load resistance of the differential driver 510 for each finger is the sum of the PFET resistance (PA or PB) and the BR resistor networks 506 or 508. The operation of a differential driver, such as differential driver 510, is well understood by those skilled in the art, and therefore, only those elements of its operation that assist in the explanation of the present invention are discussed below.

Coupled to the gates of NFETS NA and NB are driving signals VA and VAN (inverted signal of VA). Coupled to the gates of the PFETs PA and PB are thermal compensation circuits 502 and 504, respectively. Thermal compensation circuits 502 and 504 are functionally equivalent to each other. Inverters INVA and INVB feed the inverted signals of VA and VB to thermal compensation circuits 502 and 504, respectively.

Thermal compensation circuit 502 includes a turn-on/off fast response circuit 512, a turn on/off slow response circuit 514, and an amplifying circuit 516.

The turn on/off fast response circuit 512 has a PFET Pf coupled in series with a resistor Rf1 coupled in parallel with capacitor Cf, resistor Rf2, and NFET Nf.

In a similar fashion, the turn on/off slow response circuit 514 has a PFET Pl coupled in series with Rl1 and in parallel with capacitor Cl, Rl2 and NFET Nl.

The gates of PFETs Pf, Pl and NFETS Nf and Nl are coupled to the output of inverter INVA.

Capacitor Cf and resistor Rf1 form an RC network with a charge time constant equivalent to the turn-on fast thermal time constant (e.g., $10^{-07}$ to $10^{-05}$ and $10^{-02}$ to $10^{-1}$ time periods on FIG. 1), and capacitor Cf and resistor Rf2 form an RC network with a discharge time constant equal to the turn-off fast thermal time constant.

Similarly, capacitor Cl and resistor Rl1 form an RC network with a charge time constant equal to the turn-on slow thermal time constant (e.g., $10^{-05}$ to $10^{-03}$ time periods on FIG. 2), and capacitor Cl and resistor Rl2 form an RC network with a discharge time constant equal to the turn-off slow thermal time constant.

Voltage supplies Vf and Vl control the magnitudes of the compensations from the turn on/off fast and slow response circuits 512 and 514, respectively.

The amplifying circuit 516 includes an operational amplifier (OPM) 516A. Resistors R2 and R3 are coupled to the negative input of the OPM and the joint points of the resistors Rf1 and Rf2, and Rl1 and Rl2, respectively. Resistor R1 is coupled to the output OPM and negative input of the amplifier 516A. The input resistors R2, R3 and the feedback resistor R1 form a sum operation of the voltages on capacitors Cf and Cl.

The transition of signal VA from a logic low to a logic high results in NFET NA turning on and the resistance of the corresponding finger increases. At the same time, PFETs Pf and Pl are turned on and capacitors Cf and Cl are charged since NFETs Nf and Nl are off. The OPM output voltage decreases with the fast and slow time constants such that the resistance of the PFET PA is decreased so that the total load resistance of the finger remains within a desire range (e.g., 50 ohms).

Conversely, the transition of signal VA from a logic high to a logic low results in NFET NA turning off and the resistance of the corresponding finger decreases. At the same time, PFETS Pf and Pl are turned off and NFETs Nf and Nl are turned on resulting in the discharging of capacitors Cf and Cl. As a result, the output voltage of OPM increases with the fast and slow time constants such that the resistance of PFET PA is increased so that the total load resistance of the finger remains within a designated range.

Figure 5:
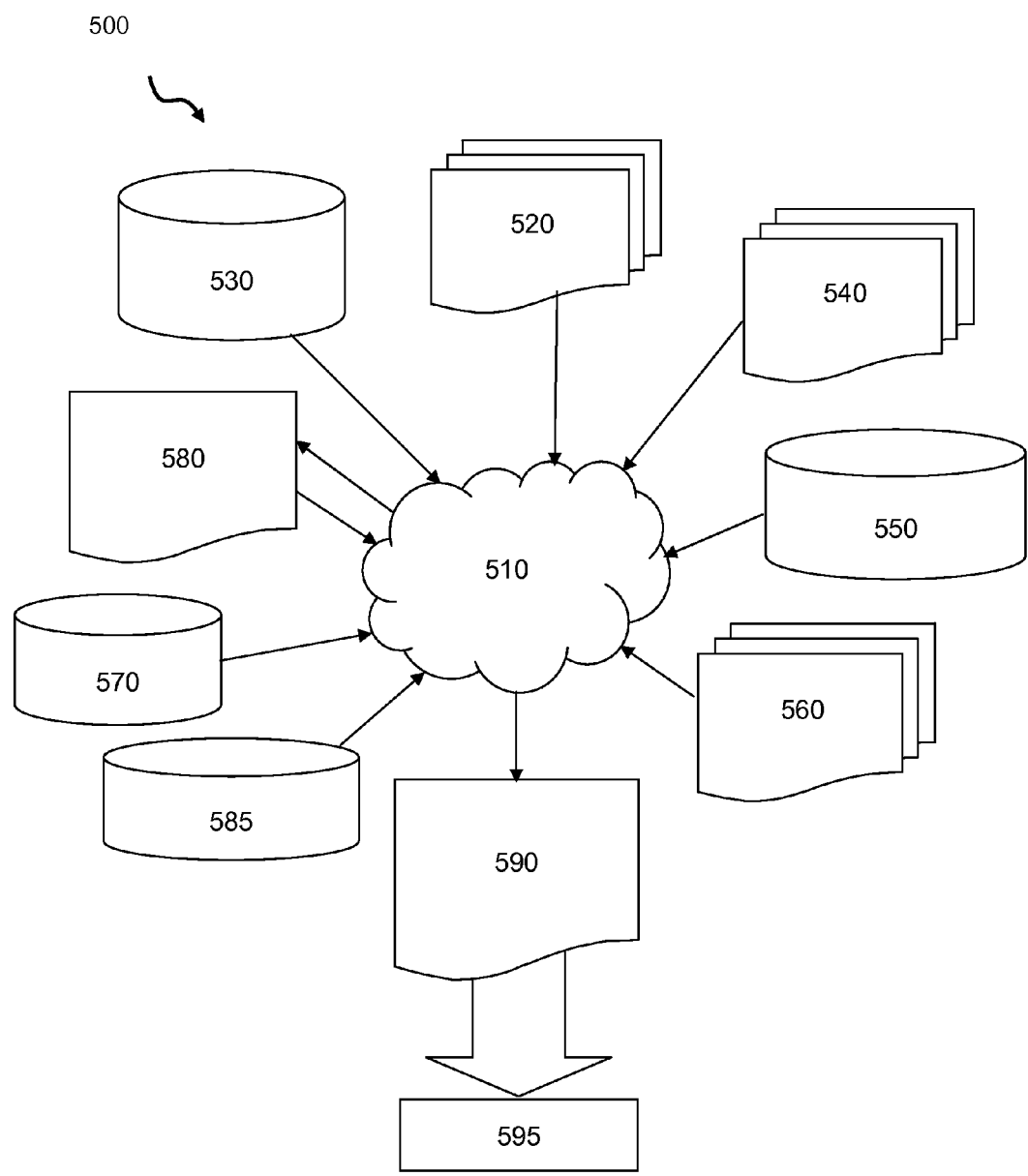
FIG. 5 is a flow diagram of a design process used, for example, to design an integrated circuit.

FIG. 5 shows a block diagram of an exemplary design flow 500 used for example, in semiconductor IC logic design, simulation, test, layout, and manufacture. Design flow 500 includes processes and mechanisms for processing design structures or devices to generate logically or otherwise functionally equivalent representations of the design structures and/or devices described above and shown in FIG. 2 or 4. The design structures processed and/or generated by design flow 500 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 500 may vary depending on the type of representation being designed. For example, a design flow 500 for building an application specific IC (ASIC) may differ from a design flow 500 for designing a standard component or from a design flow 500 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 520 that is preferably processed by a design process 510. Design structure 520 may be a logical simulation design structure generated and processed by design process 510 to produce a logically equivalent functional representation of a hardware device. Design structure 520 may also or alternatively comprise data and/or program instructions that when processed by design process 510, generate a functional representation of the physical structure of a hardware device. Whether representing functional and/or structural design features, design structure 520 may be generated using electronic computer-aided design (ECAD) such as implemented by a core developer/designer. When encoded on a machine-readable data transmission, gate array, or storage medium, design structure 520 may be accessed and processed by one or more hardware and/or software modules within design process 510 to simulate or otherwise functionally represent an electronic component, circuit, electronic or logic module, apparatus, device, or system such as those shown in FIG. 2 or 4. As such, design structure 520 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 510 preferably employs and incorporates hardware and/or software modules for synthesizing, translating, or otherwise processing a design/simulation functional equivalent of the components, circuits, devices, or logic structures shown in FIG. 2 or 4 to generate a netlist 580 which may contain design structures such as design structure 520. Netlist 580 may comprise, for example, compiled or otherwise processed data structures representing a list of wires, discrete components, logic gates, control circuits, I/O devices, models, etc. that describes the connections to other elements and circuits in an integrated circuit design. Netlist 580 may be synthesized using an iterative process in which netlist 580 is resynthesized one or more times depending on design specifications and parameters for the device. As with other design structure types described herein, netlist 580 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 510 may include hardware and software modules for processing a variety of input data structure types including netlist 580. Such data structure types may reside, for example, within library elements 530 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 540, characterization data 550, verification data 560, design rules 570, and test data files 585 which may include input test patterns, output test results, and other testing information. Design process 510 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 510 without deviating from the scope and spirit of the invention. Design process 510 may also include modules for performing standard circuit design processes such as timing analysis, verification, design rule checking, place and route operations, etc.

Design process 510 employs and incorporates logic and physical design tools such as HDL compilers and simulation model build tools to process design structure 520 together with some or all of the depicted supporting data structures along with any additional mechanical design or data (if applicable), to generate a second design structure 590. Design structure 590 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 520, design structure 590 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 2 or 4. In one embodiment, design structure 590 may comprise a compiled, executable HDL simulation model that functionally simulates the devices shown in FIG. 2 or 4.

Design structure 590 may also employ a data format used for the exchange of layout data of integrated circuits and/or symbolic data format (e.g. information stored in a GDSII (GDS2), GL1, OASIS, map files, or any other suitable format for storing such design data structures). Design structure 590 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 2 or 4. Design structure 590 may then proceed to a stage 595 where, for example, design structure 590: proceeds to tape-out, is released to manufacturing, is released to a mask house, is sent to another design house, is sent back to the customer, etc.

It is thus believed that the operation and construction of the present invention will be apparent from the foregoing description. While the design structure as shown and described has been characterized as being preferred, it will be readily apparent that various changes and/or modifications could be made without departing from the spirit and scope of the present invention as defined in the following claims.

What is claimed is:

1. A hardware description language (HDL) design structure encoded on a machine-readable data storage medium;

the design structure comprising elements that when processed in a computer-aided design system generates a machine-executable representation of a circuit for compensating for a variance in the resistance of a buried resistor, and wherein said design structure further comprises:

a waveform that is representative of the thermal characteristics of a first and second buried resistor; and functions to compensate for the variance in resistance according to the waveform the compensation circuit (500) further comprises a first and second thermal compensation unit (502, 504), a first and second inverter (INVA, INVB), and a differential driver (510);

the differential driver (510) further comprising at least a first and second pFET (PA, PB), and a first and second nFET (NA, NB), the first and second pFET (PA, PB) are coupled in series with a voltage supply (VDD) and the first and second buried resistor (506, 508) and the first and second nFET (NA, NB) respectively;

the first thermal compensation unit (502) comprises a fast response circuit (512), a slow response circuit (514), and an amplifying circuit (516);

the slow response circuit (514) comprises a third pFET (Pl) coupled in series with a third resistor (Rl1) coupled in series with a first capacitor (Cl), a fifth resistor (Rl2) coupled in series to a third nFET (Nl), the fifth resistor (Rl2) and the third nFET (Nl) are coupled in parallel to the first capacitor (Cl) and further coupled to ground;

the third pFET (Pl) further coupled to the output of the first inverter (INVA), receives a first inverter signal at its gate;

an eighth resistor (R2) is further coupled to the outputs of the third resistor (Rl1) and the first capacitor (Cl) and feeds a first operational amplifier (516A), which in turn couples to the gate of the first pFET (PA) of the differential driver (510);

the fast response circuit (512) comprising a fourth pFET (Pf) whose gate is coupled to the output of the first inverter (INVA) and the drain is coupled to a fourth resistor (Rf1), which is further coupled to a second capacitor (Cr) and ground;

a sixth resistor (Rf2) is coupled in series to a fourth nFET (Nf) and are subsequently coupled in parallel with the second capacitor (Cr);

a ninth resistor (R3) is coupled to the fourth resistor (Rf1) and the second capacitor (Cr), the ninth resistor (R3) is further coupled in series to a seventh resistor (R1), which is further coupled to the gate of the first pFET (PA), thereby altering the resistance of the first pFET (PA) to compensate for variance in resistance of first resistor (506).

2. The design structure of claim 1, wherein the machine-executable representation of a circuit comprises:

waveform is coupled to the input of the first inverter (INVA).

3. The design structure of claim 1, wherein the thermal characteristics is the thermal time constant of the buried resistor.

4. The design structure of claim 3 wherein the thermal time constant is the thermal behavior of the first or second resistor over a specific period of time.

5. The design structure of claim 4 wherein the specific period of time represents at least two phases of the thermal response where the temperature of the first or second resistor increases significantly when compared to a second periods of time.

6. The design structure of claim 1, wherein the design structure comprises a netlist.

7. The design structure of claim 1, wherein the design structure resides on storage medium as a data format used for the exchange of layout data of integrated circuits.

8. The design structure of claim 1, wherein the design structure resides in a programmable gate array.

* * * * *